(12) United States Patent
Yang (10) Patent No.: US 9,130,817 B2
(45) Date of Patent: Sep. 8, 2015

(54) LOW POWER TRANSMITTER FOR GENERATING PULSE MODULATED SIGNALS

(75) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/993,308

(22) PCT Filed: Dec. 15, 2011

(86) PCT No.: PCT/US2011/065175
§ 371 (c)(1),
(2), (4) Date: Jun. 11, 2013

(87) PCT Pub. No.: WO2013/089743
PCT Pub. Date: Jun. 20, 2013

(65) Prior Publication Data
US 2014/0226708 A1    Aug. 14, 2014

(51) Int. Cl.
*H03K 7/08* (2006.01)
*H03K 9/08* (2006.01)
*H04L 25/49* (2006.01)

(52) U.S. Cl.
CPC .............. *H04L 25/4902* (2013.01); *H03K 7/08* (2013.01)

(58) Field of Classification Search
CPC .............. H05B 33/0815; H05B 37/02; H02M 3/33507
USPC .......................................................... 375/238
See application file for complete search history.

(56) References Cited

U.S. PATENT DOCUMENTS

| | | | |
|---|---|---|---|
| 5,864,582 A * | 1/1999 | Ander et al. | ................... 375/238 |
| 6,037,821 A | 3/2000 | Wodnicki et al. | |
| 6,433,584 B1 | 8/2002 | Hatae | |
| 6,658,583 B1 * | 12/2003 | Kudo et al. | .................... 713/500 |
| 6,760,389 B1 | 7/2004 | Mukherjee et al. | |
| 7,054,374 B1 | 5/2006 | Jensen et al. | |
| 7,733,248 B2 | 6/2010 | Prentice | |
| 2005/0265437 A1 | 12/2005 | Yeung et al. | |
| 2005/0275568 A1 | 12/2005 | Madni et al. | |
| 2007/0290880 A1 | 12/2007 | Lin | |
| 2008/0136457 A1 | 6/2008 | Wagensohner et al. | |
| 2010/0091921 A1 | 4/2010 | Den Besten | |

(Continued)

OTHER PUBLICATIONS

Int'l Search Report and Written Opinion mailed Oct. 4, 2012 for Int'l Application No. PCT/US2011/065175.

(Continued)

*Primary Examiner* — Shuwang Liu
*Assistant Examiner* — Gina McKie
(74) *Attorney, Agent, or Firm* — Blakely, Sokoloff, Taylor & Zafman LLP (57) ABSTRACT

Described herein are an apparatus, system, and method for generating pulse modulated (PWM) signals. The apparatus (e.g., input-output transmitter) comprises: an edge detector to detect one of a rising or falling edges of a clock signal; a counter to count up or down in response to detecting one of the rising or falling edges of the clock signal, the counter to generate a select signal; and a control unit to receive a data signal for transmission to a receiver and to generate a PWM signal as output according to a value of the select signal and the data signal, wherein the receiver and the transmitter are a Mobile Industry Processor Interface (MIPI®) M-PHY$^{SM}$ receiver and transmitter.

19 Claims, 8 Drawing Sheets

(56) References Cited

U.S. PATENT DOCUMENTS

| | | |
|---|---|---|
| 2010/0091924 A1 | 4/2010 | Wu |
| 2010/0115069 A1 | 5/2010 | Winterton |
| 2010/0260283 A1 | 10/2010 | Den Besten |
| 2010/0277104 A1* | 11/2010 | Lin et al. ................ 315/312 |
| 2013/0272368 A1 | 10/2013 | Yang |

OTHER PUBLICATIONS

Transmittal of International Preliminary Report on Patentability and Written Opinion in related PCT application No. PCT/US2011/065175, mailed Jun. 26, 2014, 6 pages.

Preliminary Examination of Taiwan Patent Application No. 101142865, mailed Jan. 9, 2015, 11 pages including translation.

* cited by examiner

LOW POWER TRANSMITTER FOR GENERATING PULSE MODULATED SIGNALS

CLAIM OF PRIORITY

This application claims the benefit of priority of International Patent Application No. PCT/US2011/065175 filed Dec. 15, 2011, titled "LOW POWER TRANSMITTER FOR GENERATING PULSE MODULATED SIGNALS," which is incorporated by reference in its entirety.

FIELD OF THE INVENTION

Embodiments of the invention relate generally to the field of low power input-output (I/O) transceivers. More particularly, embodiments of the invention relate to an apparatus, system, and method for generating pulse modulated (PWM) signals by low power logic units.

BACKGROUND

As power dissipation becomes a standard performance benchmark for consumer electronics, for example, tablet PCs, smart phones, low power laptops or net-books, etc, traditional high speed input-output (I/O) transceivers used in processors of such consumer devices (or any other low power device) are not optimum for low power operation. Such traditional high speed I/O transceivers have many analog components which are not scalable to newer process technologies. Traditional high speed I/O transceivers are unable to meet the stringent low power specifications of Mobile Industry Processor Interface (MIPI®) as described in the MIPI® Alliance Specification for M-PHY$^{SM}$ Version 1.00.00 of Feb. 8, 2011 and approved on Apr. 28, 2011.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to an apparatus, system, and method for generating Pulse Width Modulated (PWM) data for transmission. In one embodiment, the apparatus is a transmitter which comprises an edge detector to detect one of rising or falling edges of a clock signal. The clock signal has a frequency which is a multiple of a core clock signal frequency. In one embodiment, the transmitter further comprises a counter to count up or down in response to detecting one of the rising or falling edges of the clock signal, the counter to generate a select signal. In one embodiment, the counter is a 4-bit counter and the clock signal has a frequency which is 6 times faster than a core clock frequency, where the core clock is the clock used in the core of the processor comprising the transmitter. In another embodiment, the counter is a 2-bit counter and the clock signal has a frequency which is 3 times faster than the core clock frequency. In one embodiment, the transmitter further comprises a control unit to receive a data signal for transmission and to generate a PWM signal as output according to a value of the select signal and the data signal.

The technical effects of the embodiments discussed herein are many, including low power PWM data signal generation and transmission for input/output (I/O) transceivers. In one embodiment, the I/O transceivers comprise a receiver and a transmitter which are a Mobile Industry Processor Interface (MIPI®) M-PHY$^{SM}$ receiver and transmitter, which consume low power consumption compared to traditional I/O transceivers. The PWM signal generation scheme discussed herein is a fully scalable digital design, i.e. the design can be migrated to different process technologies (e.g., CMOS and High-K metal process technologies) with simple resizing of the transistors of the digital design. Such fully scalable digital design saves design, validation, and layout time.

The transmitter architecture of the embodiments discussed herein is scalable to operate at low frequency as well as high frequency by changing the input clock frequency (the core clock frequency) and/or the length of the counter. The technical effects discussed herein are not limited by the ones discussed above. Other technical effects are also contemplated by the embodiments discussed herein.

The term "low frequency" herein refers to the minimum GEAR specifications of MIPI®. The term "GEAR" herein refers to a speed range of a pulse wave modulated signal as defined by specifications of MIPI®. Low frequency data transfers are in the range of 3-192 Mb/s for the low frequency ends of GEAR1-GEAR7. The term "high frequency" herein refers to the maximum GEAR specifications of MIPI®. High frequency data transfers are in the range of 9-576 MB/s for the high frequency ends of GEAR1-GEAR7.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 1:
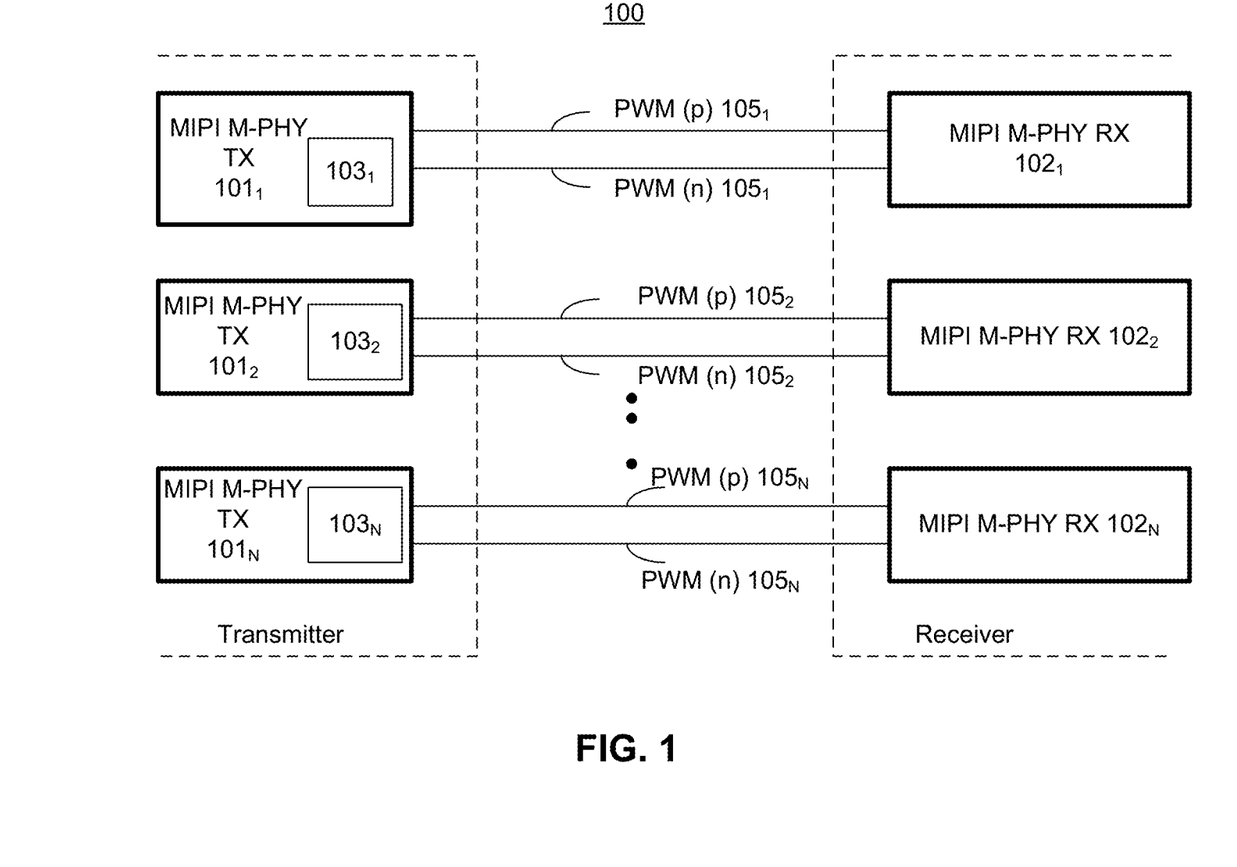
FIG. 1 is a high level system input-output (I/O) link with a transmitter which is configured to generate pulse width modulated (PWM) data via low power logic units, according to one embodiment of the invention.

FIG. 1 is a high level system input-output (I/O) link 100 with a transmitter which is configured to generate PWM data via low power logic units, according to one embodiment of the invention. In one embodiment, each transmitter (e.g., $101_{1-N}$) includes a corresponding logic architecture $103_{1-N}$ for low power generation of a PWM signal. While the system 100 is described herein as a MIPI® M-PHY$^{SM}$ Link as defined by the MIPI® Alliance Specification for M-PHY$^{SM}$ Version 1.00.00 of Feb. 8, 2011 and approved on Apr. 28, 2011, in other embodiments, the system 100 is any I/O link which is operable for low power transmission of PWM signals.

In one embodiment, the system 100 is a MIPI® M-PHY$^{SM}$ Link which comprises MIPI® M-PHY$^{SM}$ transmitters (M-TXs) $101_{1-N}$, point-to-point interconnects for carrying PWM (p) $105_{1-N}$ and PWM (n) $105_{1-N}$, and MIPI® M-PHY$^{SM}$ receivers (M-RXs) $102_{1-N}$. In the embodiments discussed herein, the M-TXs $101_{1-N}$ comprise logic units $103_{1-N}$ for low power PWM signal generation. The system 100 comprises lanes 1-N, where N is an integer greater than 1, and wherein each lane includes an M-TX, M-RX, and a pair of point-to-point interconnects. The term "DIF_P" or "DIF-P" and "DIF_N" or "DIF-N" herein refer to differential signals as defined by the MIPI® Alliance Specification for M-PHY$^{SM}$ Version 1.00.00 of Feb. 8, 2011 and approved on Apr. 28, 2011.

In one embodiment, the transmitter and receiver of the system 100 are in different processors positioned in a consumer electronic (CS) device. In one embodiment, the CS device may be a tablet PC, a smart-phone, or any other low power consuming device. In one embodiment, the system 100 is coupled to a display unit (not shown) which is operable to display contents transmitted by the transmitter $101_1$ and received by the receiver $102_1$. In one embodiment, the display unit is a touch pad or a touch screen.

So as not to obscure the embodiments of the invention, TX $101_1$, PWM (p) $105_1$, PWM (n) $105_1$, RX $102_1$, and logic unit $103_1$ are discussed. The signals PWM (p) $105_1$ and PWM (n) $105_1$ are the two signals of a differential PWM signal. The discussion is applicable to other TX and RX of the system 100.

Figure 2A:
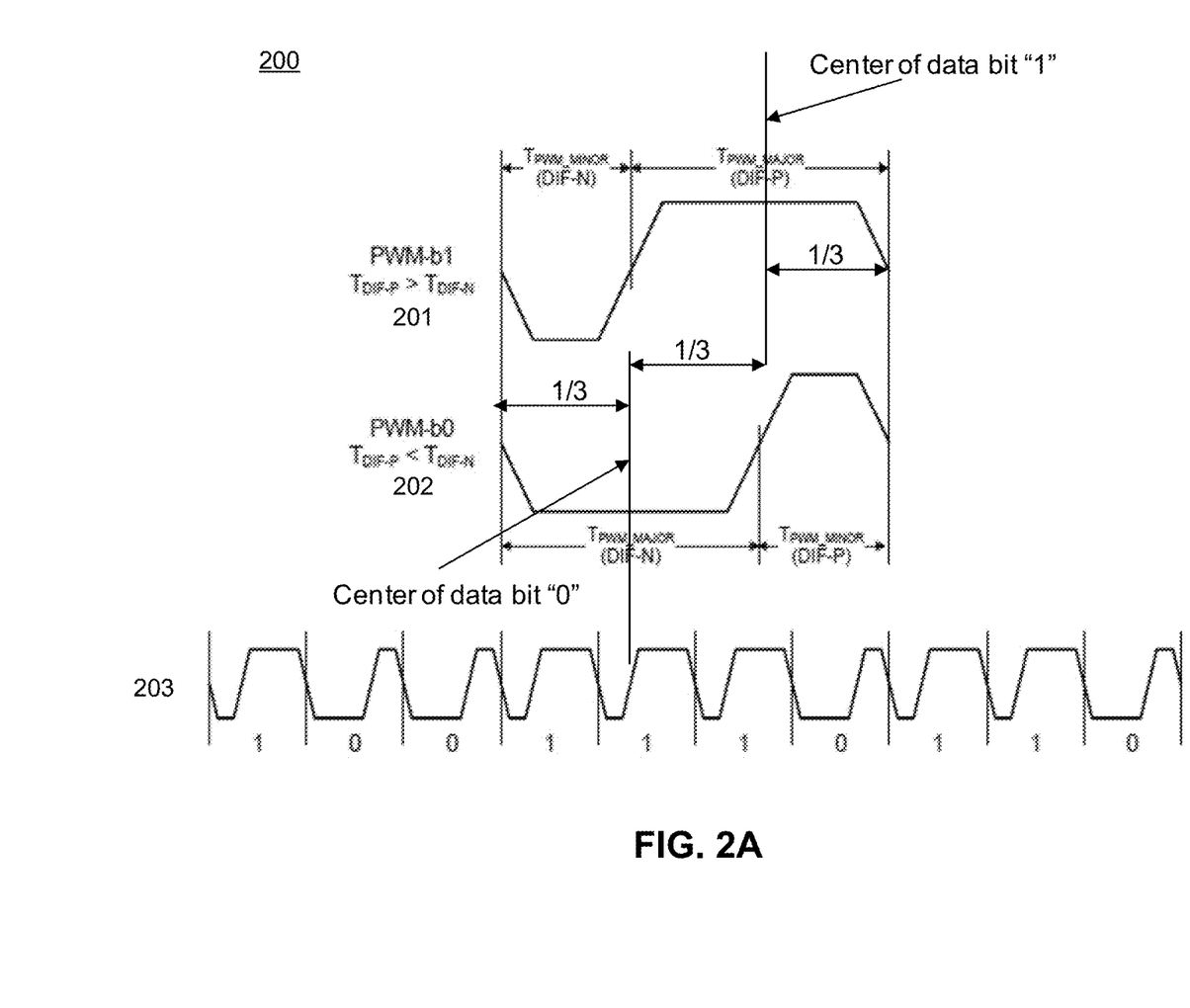
FIG. 2A is a PWM waveform as used in the embodiments described herein.

FIG. 2A is PWM waveform 200 as used in the embodiments described herein. PWM is a bit modulation scheme carrying data information in the duty cycle of the waveform. In one embodiment, the point-to-point interconnects carry the PWM signals, such as the PWM (p) $105_{1-N}$ and PWM (n) $105_{1-N}$ signal. So as not to obscure the embodiments of the invention, the PWM waveform 200 is a single-ended waveform (e.g., PWM (p) $105_1$ or PWM (n) $105_1$) and illustrated to show the components of the PWM waveform.

The PWM scheme has self-clocking properties because the clock information is in the period of the PWM waveform 200. Each bit in the PWM waveform 200 consists of a combination of two sub-phases, a DIF_N followed by a DIF_P. One of the two sub-phases is longer than the other, i.e. $T_{PWM\_MAJOR} > T_{PWM\_MINOR}$, depending on whether the bit in the PWM waveform 200 is a binary '1' or a binary '0.' The binary information in the PWM waveform 200 is in the ratio of the duration of the DIF_N and DIF_P states.

For example, if the LINE state is DIF_P for the majority of the bit period, the bit is a binary '1' 201 (PWM-b1). Likewise, if the LINE state is DIF_N for the majority of the bit period, the bit is a binary '0' 202 (PWM-b0). The term "LINE" herein refers to the differential point-to-point differential serial connection.

Each bit period of the PWM waveform 200 contains two edges, where the falling edge is at a fixed position and the rising edge position is modulated. Accordingly, the PWM bit stream 203 explicitly contains a bit clock with period $T_{PWM}$, which equals the duration of one bit. In one embodiment, the logic unit $103_1$ (discussed with reference to FIGS. 3A-B) of the TX $101_1$ is operable to generate the PWM waveform 200 with low power digital logic units.

Figure 2B:
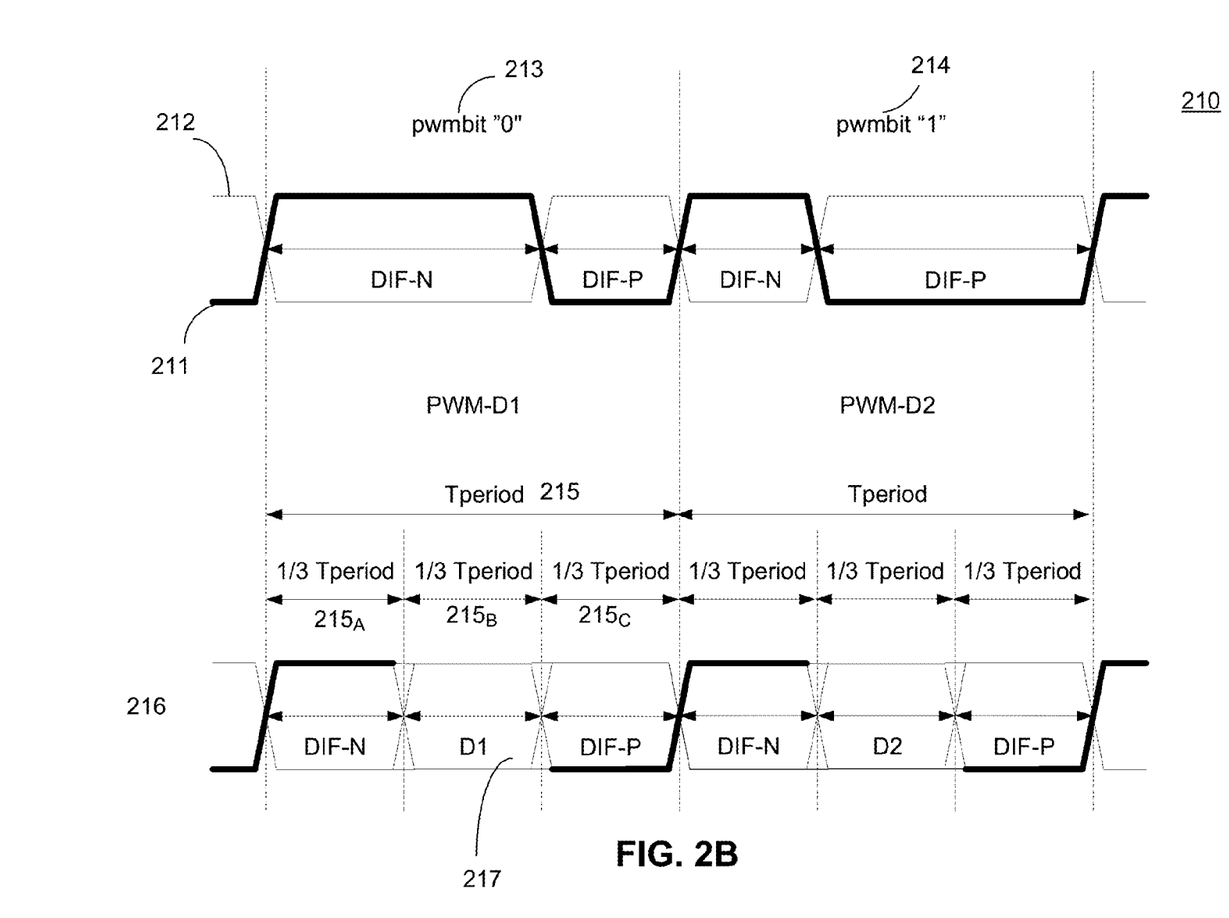
FIG. 2B is a PWM waveform generated by the transmitter, according to one embodiment of the invention.

FIG. 2B are waveforms 210 including the PWM waveform 216 generated by the TX $101_1$, according to one embodiment of the invention. The pair of waveforms on the top are differential PWM waveforms 212 and 211 (which correspond to one of PWM (p) $105_1$ or PWM (n) $105_1$). The first half 213 of the waveforms 212 and 211 is a bit '0' and the second half 214 of the waveforms 212 and 211 is a bit '1.' The pair of waveforms 216 on the bottom of FIG. 2B illustrate a break down in time domain of a time period 215 of the PWM waveform 212 and 211. The following description pertains to waveform 212 (the un-bold waveform), where the bold waveform is the corresponding differential component 211 of the waveform 212.

The time period 215 of the PWM waveforms 211 and 212 can be divided equally into three portions—$215_A$, $215_B$, and 215. The first portion $215_A$, i.e. the first one third of the time period 215, is a logical zero for the PWM waveforms 211 and 212 according to the MIPI® Alliance Specification for M-PHY$^{SM}$ while the last ⅓ portion $215_C$ is a logical one according to the MIPI® Alliance Specification for M-PHY$^{SM}$. The middle portion $215_B$ represents the data 217 being transmitted in the PWM waveforms 211 and 212 according to the MIPI® Alliance Specification for M-PHY$^{SM}$. Since PWM waveforms 211 and 212 are differential signal components of a differential PWM signal, the data 217 (D1) and its corresponding inverted version are modulated in waveforms 211 and 212 respectively.

Figure 3A:
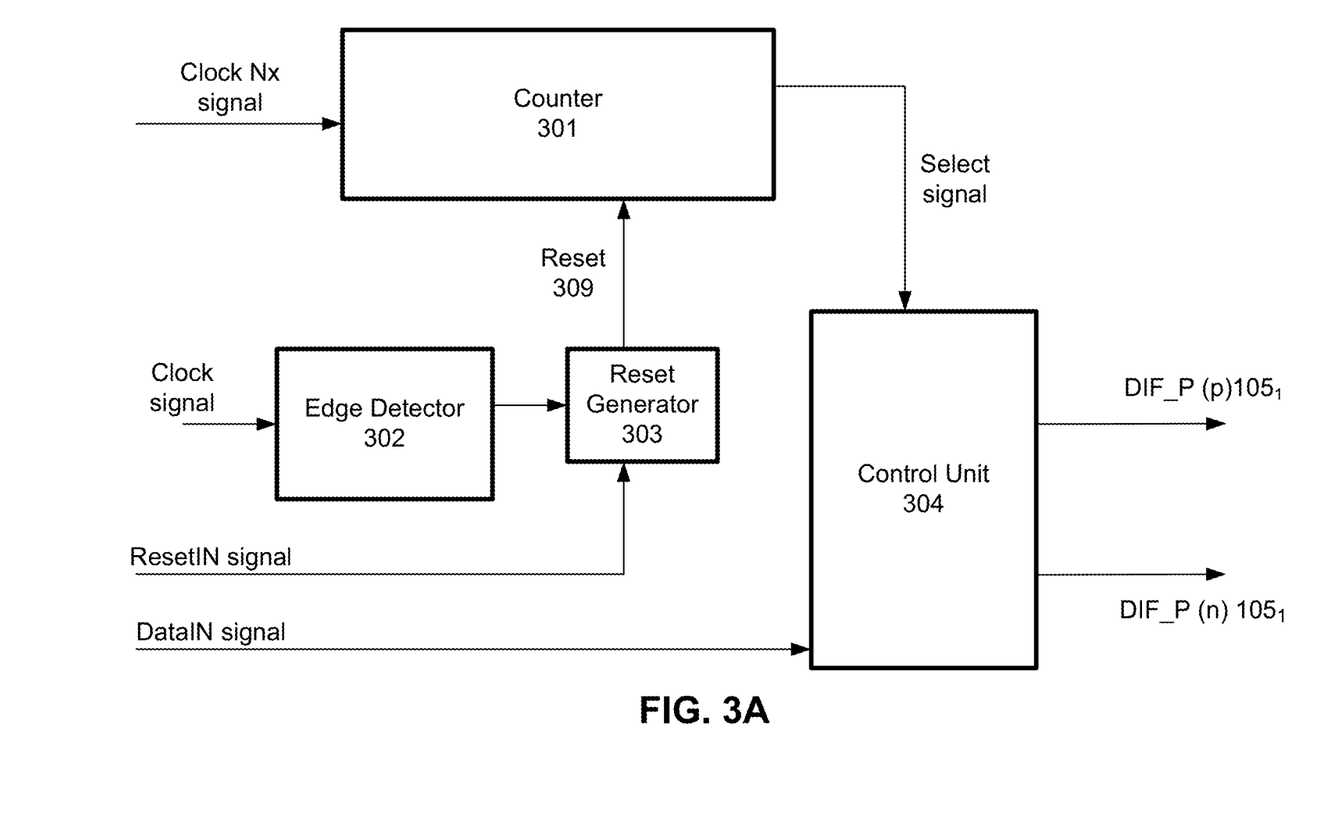
FIG. 3A is a high level logic view of the transmitter to generate the PWM data, according to one embodiment of the invention.

FIG. 3A is a high level logic view of the logic unit $300/103_1$ of the transmitter $101_1$ to generate PWM data—PWM (p) $105_1$ and PWM (n) $105_1$—according to one embodiment of the invention. The PWM signal PWM (p) $105_1$ is also referred to as the first PWM signal while the PWM signal PWM (n) $105_1$ is also referred to as the second PWM signal. The logic unit $103_1$ is described with reference to FIGS. 1-2. In one embodiment, the logic unit $103_1$ for generating the PWM waveforms—PWM (p) $105_1$ and PWM (n) $105_1$—comprises an edge detector 302 to detect one of rising or falling edges of a clock signal. So as not to obscure the embodiments of the invention, the edge detector 302 is a rising edge detector to detect a rising edge of the clock signal. However, the embodiments of the invention are operable to use a falling edge detector without changing the scope of the embodiments of the invention.

In one embodiment, the logic unit $103_1$ of the transmitter $101_1$ comprises a counter 301 to count up or down in response to detecting one of the rising or falling edges of the Clock N× signal, where N is an integer e.g., 3, 6, etc. A Clock 3× signal means that the Clock 3× signal is 3 times faster in frequency than the Clock signal. So as not to obscure the embodiments of the invention, the counter 301 is an up counter that counts on every rising edge of the Clock N× signal. However, the embodiments of the invention are operable to use a down counter without changing the scope of the embodiments of the invention. In one embodiment, the counter 301 generates a Select signal which is used to position the DataIN signal content in the middle ⅓ of the time period of the PWM waveform, e.g., data content 217 in time duration $215_B$ of FIG. 2B.

Referring back to FIG. 3A, the logic unit $103_1$ of the transmitter $101_1$ comprises a reset generator 303 coupled to the counter 301 and the edge detector 302. In one embodiment, the reset generator 303 is operable to generate a Reset signal 309 to reset the counter 301 in response to a signal level of the ResetIN signal or the signal level of the output of the edge detector 302.

In one embodiment, the logic unit $103_1$ of the transmitter $101_1$ comprises a control unit 304 which is operable to receive the DataIN signal for transmission and to generate a PWM version of the DataIN signal as PWM (p) $105_1$ and PWM (n) $105_1$ signals. In one embodiment, the control unit 304 receives the select signal from the counter 301 to position the DataIN signal content in the middle ⅓ of the time period of the PWM signals—PWM (p) $105_1$ and PWM (n) $105_1$. In one embodiment the PWM signals—PWM (p) $105_1$ and PWM (n) $105_1$—have a data rate compatible with MIPI® M-PHY$^{SM}$ GEAR rates 1 through 7.

Figure 3B:
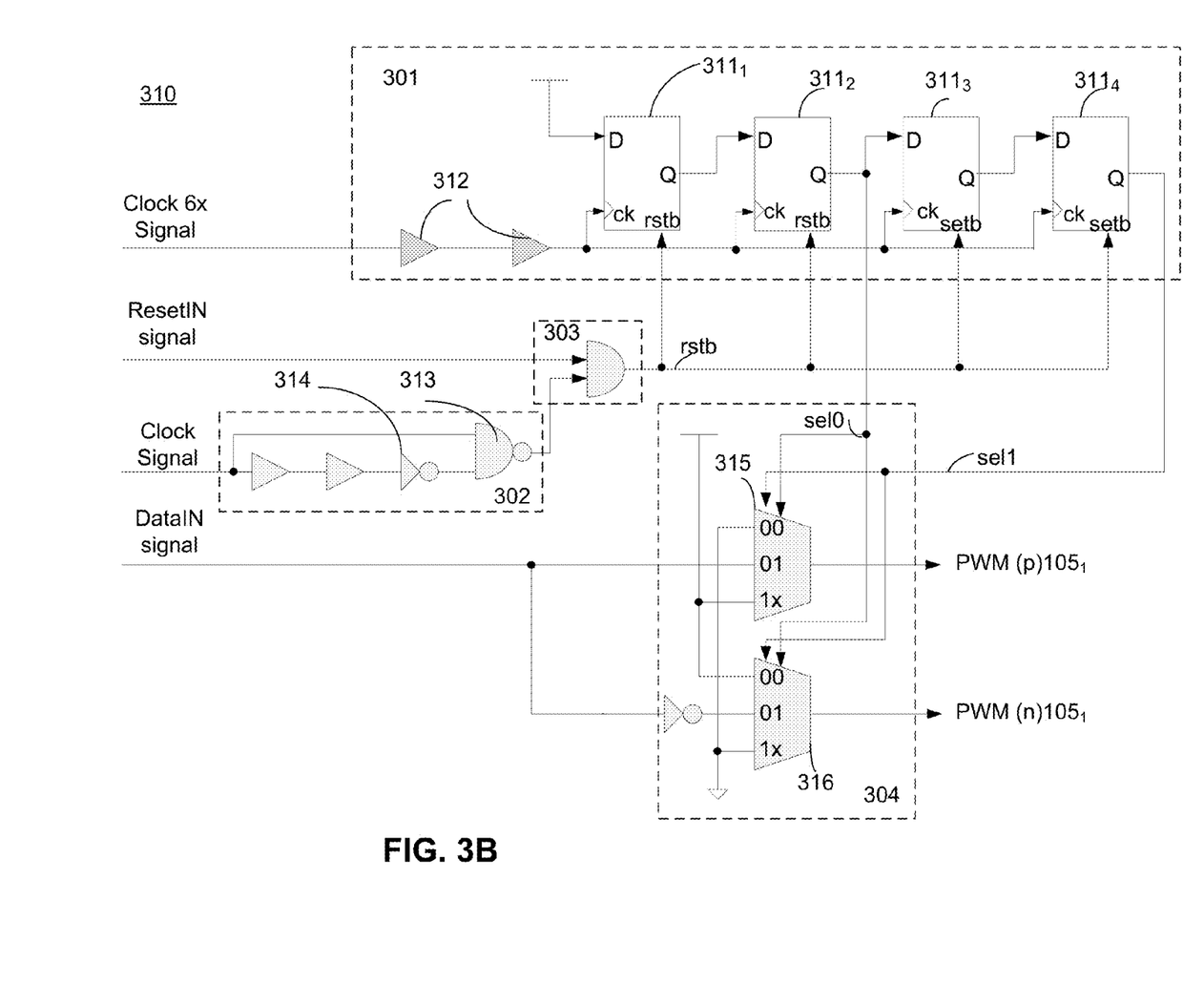
FIG. 3B is a schematic level view of a logic unit of the transmitter to generate the PWM data, according to one embodiment of the invention.

FIG. 3B is a schematic level view 310 of the logic unit $103_1$ to generate the PWM data—PWM (p) $105_1$ and PWM (n) $105_1$—according to one embodiment of the invention. FIG. 3B is described with reference to FIGS. 1-2 and FIG. 3A. In this embodiment, the counter 301 is a 4-bit counter comprising four sequential logic units $311_{1-4}$ which operate on the Clock 6× signal, i.e. N=6. In one embodiment, the sequential logic units $311_{1-4}$ are flip-flops. In other embodiments, other forms of sequential logic units $311_{1-4}$ may be used without changing the scope of the embodiments of the invention. In one embodiment, the counter 301 includes one or more clock buffers 312 to provide a buffered version of the Clock 6× signal to the clock terminals of the sequential logic units $311_{1-4}$. In one embodiment, the sequential logic units $311_{1-4}$ are operable to be reset by the Reset signal 309 (same as rstb signal). In one embodiment, the Select signal includes sel0 and sel1 signals generated by the counter 301. In one embodiment, the sel0 signal is generated by the sequential logic unit $311_2$ while sel1 is generated by the sequential logic unit $311_4$.

In one embodiment, sel0 and sel1 are used as control signals for the multiplexers 315 and 316 of the control unit 304. In such an embodiment, when the sel1 signal is a logical low and the sel0 signal is a logical high then the DataIN signal is passed on by the multiplexer 315 as the PWM (p) $105_1$ signal. In this embodiment, the DataIN signal is positioned in the middle portion $215_B$ of the time period 215. In one embodiment, when the sel0 and sel1 signals are logical low then a logical low signal is passed on by the multiplexer 315 as the PWM (p) $105_1$ signal. In this embodiment, the logical low signal forms the first portion $215_A$ of the time period 215 of the PWM (p)$105_1$ signal. In one embodiment, when the sel1 signal is a logical high, then a logical high value is passed on by the multiplexer 315 as the PWM (p) $105_1$ signal. In this embodiment, the logical high signal forms the last portion $215_C$ of the time period 215 of the PWM (p) $105_1$ signal.

The multiplexer 316 operates similarly as the multiplexer 315 except that the select signals sel0 and sel1 are swapped compared to the select signals of the multiplexer 315, and an inverted version of the DataIN signal is positioned in the middle portion $215_B$ of the time period 215 of the PWM (n) $105_1$ signal when the select signals sel0 and sel1 are logical low and high respectively.

In one embodiment, the edge detector 302 comprises a NAND gate 313 which is operable to receive two versions of the Clock signal. In one embodiment, the Clock signal is the core clock signal. In one embodiment, the first version of the Clock signal is a delayed and inverted version of the Clock signal which is inverted by inverter 314. In this embodiment, the second version of the Clock signal is an un-delayed version of the Clock signal. The output of the edge detector 302 generates a transition edge on a rising edge of the Clock signal.

In one embodiment, the counter 301 is reset in response to detecting a rising edge of the Clock signal. In the embodiments discussed herein a reset logic unit 303 is used to generate the Reset signal 309 (same as rstb) in response to the detected rising edge of the Clock signal and/or an external ResetIN signal. In one embodiment, the reset logic unit 303 comprises an AND gate. In other embodiments, a NAND or NOR gate may also be used to implement the reset logic unit 303. The operation of the logic unit $103_1$ (same as 310) is discussed with reference to the timing diagram of FIG. 4.

Figure 4:
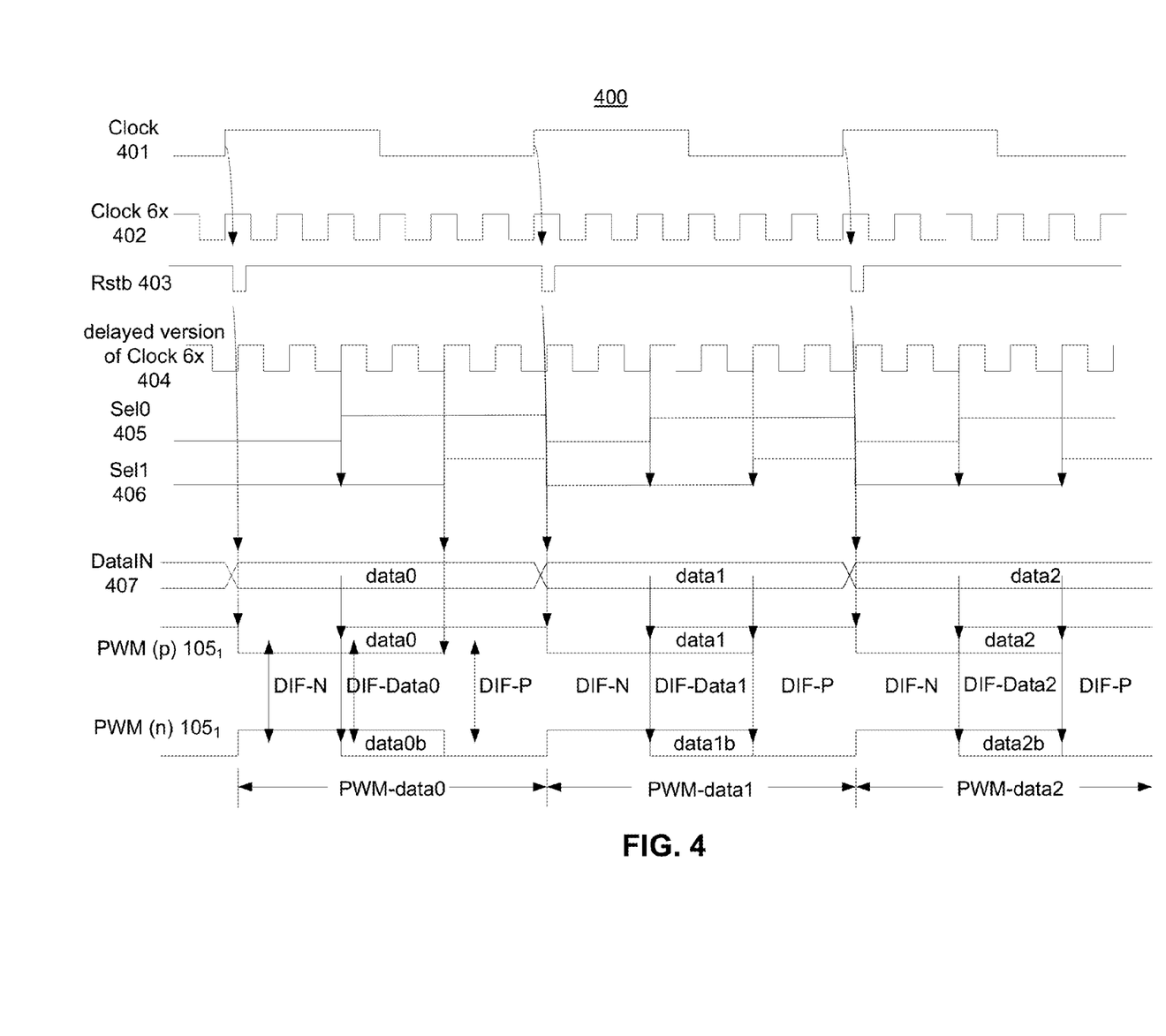
FIG. 4 is a set of waveforms of various signals of the schematic level view of the logic unit of the transmitter, according to one embodiment of the invention.

FIG. 4 is a set of waveforms 400 of various signals of the schematic level view of the logic unit $103_1$/310, according to one embodiment of the invention. The waveforms 400 are described with reference to FIGS. 1-3. Clock 401 corresponds to Clock signal of FIGS. 3A-B (same as core clock signal). Clock 6× 402 corresponds to Clock 6× signal of FIG. 3B. Rstb 403 corresponds to Rstb signal (Reset signal 309) of FIGS. 3A-B. Delayed version of Clock 6× 404 corresponds to the output of the clock buffer 312 in the counter 301 of FIG. 3B. Sel0 405 corresponds to Sel0 of FIG. 3B while Sel1 406 corresponds to Sel1 of FIG. 3B. DataIN 407 corresponds to DataIN signal of FIGS. 3A-B.

In this embodiment, the Clock 6× 402 has a frequency which is 6 times faster than the frequency of the Clock signal 401. In response to detecting the first rising edge of the Clock signal 401, the edge detector 302 generates the Rstb signal 403 (assuming that the ResetIN signal is a logical high as input to the AND gate of Reset logic unit 303). The Rstb signal 403 resets the counter 301 to cause the output of the Select signals—Sel0 405 and Sel1 406—to be logical low resulting in the multiplexer 315 to pass on a logical low for the PWM (p) $105_1$ signal and resulting in the multiplexer 316 to pass on a logical high for the PWM (n) $105_1$ signal.

In one embodiment, when the counter counts the third cycle of the delayed version of Clock 6× 404 signal then the Sel0 405 is a logical high while Sel1 406 remains at logical low level. In such an embodiment, the multiplexers 315 and 316 pass on the DataIN signal and its inverted version as PWM (p) $105_1$ and PWM (n) $105_1$ signals respectively. In this embodiment, the select signals—Sel0 405 and Sel1 406—cause the DataIN signal and its inverted version to be positioned in the middle portion $215_B$ of the PWM (p) $105_1$ and PWM (n) $105_1$ signals respectively. When the counter 301 value reaches four, i.e. Sel0 405 and Sel1 406 are both logical high levels, then the DataIN signal and its inverted version are no longer passed on by the multiplexers 315 and 316 as PWM (p) $105_1$ and PWM (n) $105_1$ signals respectively. In such an embodiment, a logical high is passed on by the multiplexer 315 as PWM (p) $105_1$ signal which corresponds to the $215_C$ portion of the time period 215 while a logical low is passed on by the multiplexer 316 as PWM (n) $105_1$ signal.

Figure 5:
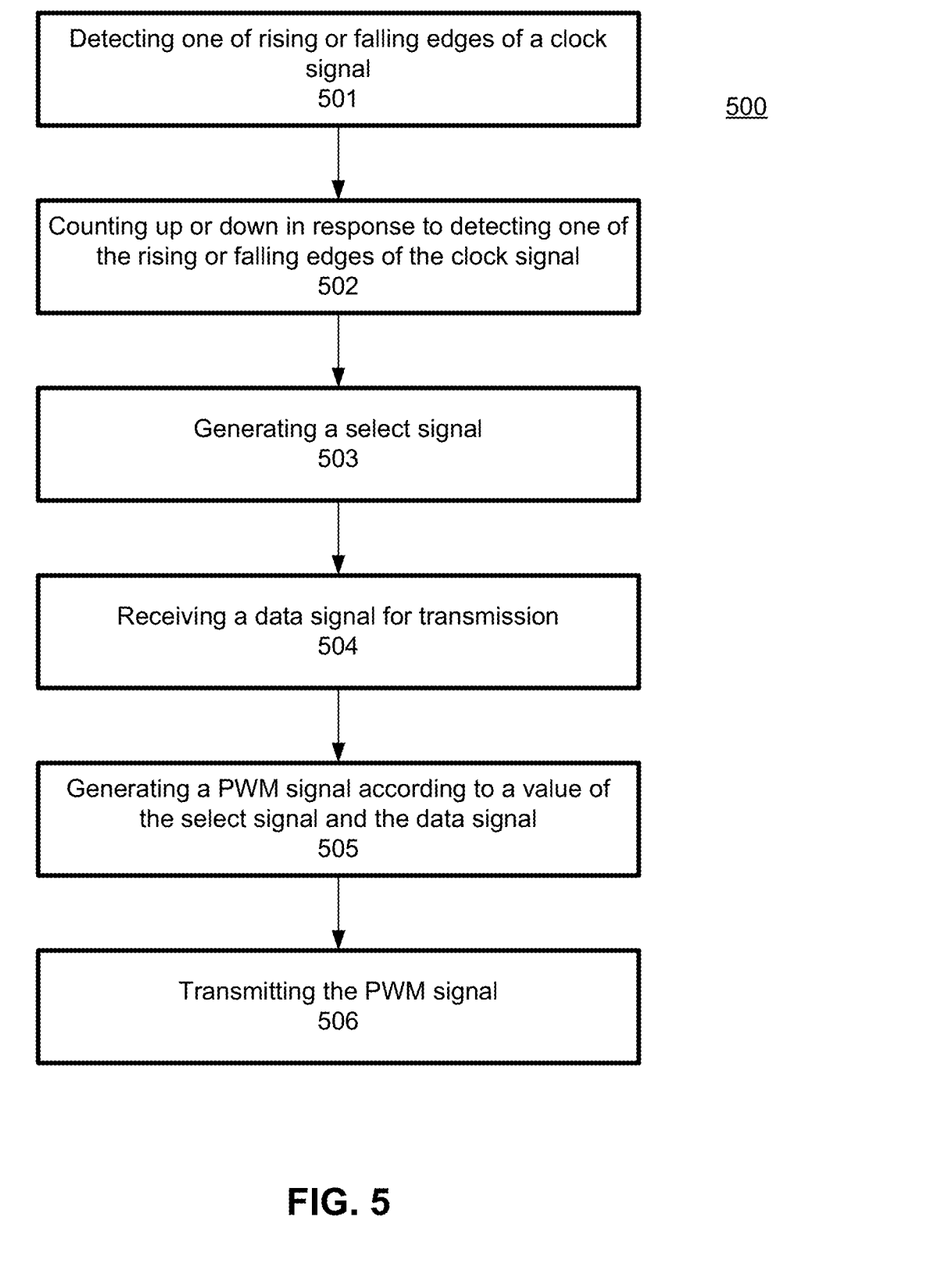
FIG. 5 is a flowchart of a method to generate the PWM data, according to one embodiment of the invention.

FIG. 5 is a flowchart 500 of a method to generate the PWM data, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments of generating a PWM signal using low power logic units. The flowchart of FIG. 5 is illustrated with reference to the embodiments of FIGS. 1-4.

At block 501, the edge detector 302 detects one of rising or falling edges of the Clock signal 401. So as not to obscure the embodiments, the edge detector 302 detects the rising edges of the Clock signal 401. As discussed herein, the edge detector 302 can be configured to detect a falling edge of the Clock signal 401 without changing the scope of the embodiments of the invention. At block 502, the counter 301 counts up or down in response to detecting one of the rising or falling edges of the Clock signal 401. So as not to obscure the embodiments, the counter 301 counts up from zero, i.e. upon being reset by the Rstb signal 403 (same as signal 309) which is generated upon detecting the rising edges of the Clock signal 401.

At block 503, the counter 301 generates the Select signal, i.e. signals Sel0 and Sel1. The Select signal determines when to pass on DataIN signal 407 as PWM (p) $105_1$ and PWM (n) $105_1$ signals. At block 504, the DataIN signal 407 is received by the logic unit $103_1$ for transmission as a PWM signal. At block 505, the control unit 304 generates the PWM (p) $105_1$ and PWM (n) $105_1$ signals according to the logical levels of the Select signals—Sel0 and Sel1. At block 506 the PWM (p) $105_1$ and PWM (n) $105_1$ signals are transmitted out to the receiver $102_1$, wherein transmitting the first and second PWM signals—PWM (p) $105_1$ and PWM (n) $105_1$ signals—comprises outputting the first and second PWM signals when the select signal indicates that the counter 301 counted up by a third of a period of a core clock signal 401, and wherein the clock signal 402 has a frequency which is a multiple of the core clock signal 401 frequency.

Figure 6:
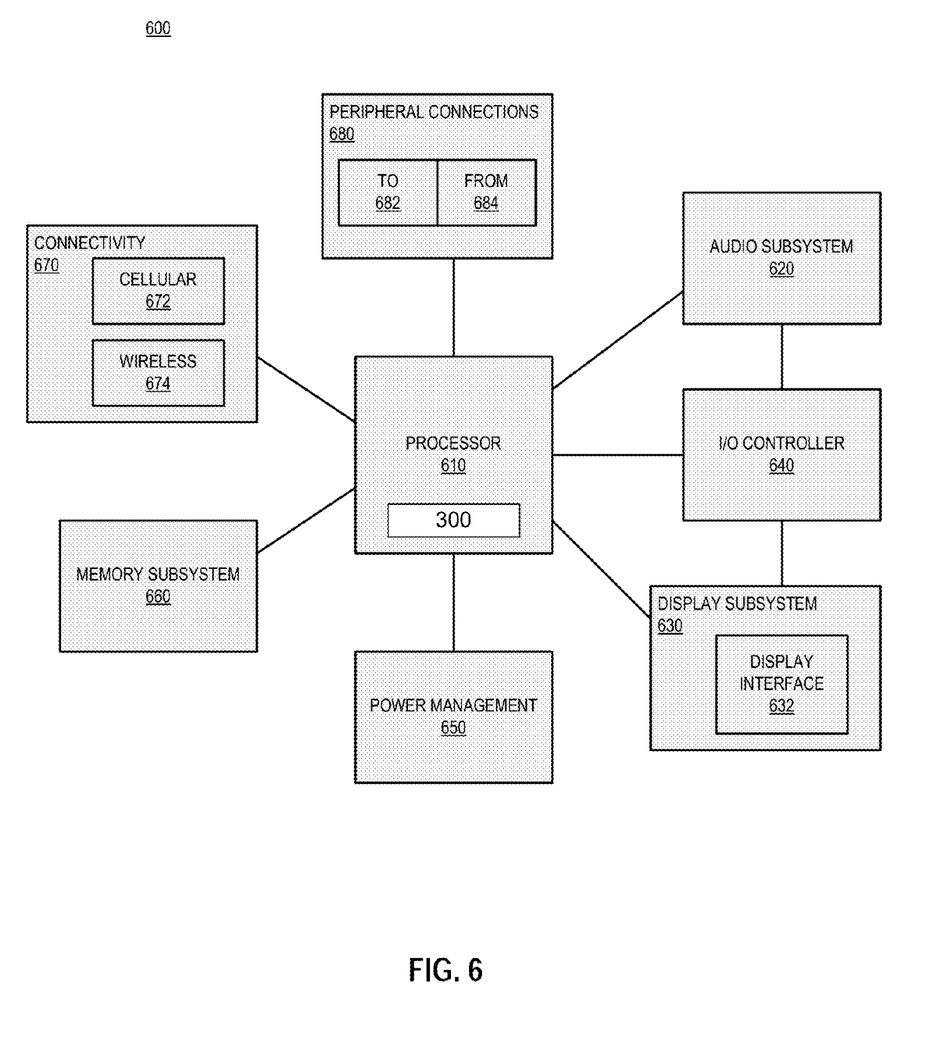
FIG. 6 is a system level diagram comprising a processor having the transmitter to generate the PWM data, according to one embodiment of the invention.

FIG. 6 is a system level diagram comprising a processor having the transmitter to generate the PWM data, according to one embodiment of the invention. FIG. 6 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 comprises transmitters $101_{1-N}$ with logic units $300/103_{1-N}$ for generating PWM (p) $105_{1-N}$ and PWM (n) $105_{1-N}$ signals for transmission as discussed with reference to FIGS. 1-4.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, any counting means for determining the ⅓ and ⅔ time points of the data signal can be used for generating the select signal for the control unit. While the embodiments are discussed with reference to data generation for MIPI GEARs 1-7, the scope of the embodiments are not limited to MIPI. The embodiments herein are not limited to the 4 bit counter in FIG. 3B. In one embodiment, the counter is a 2 bit counter and the clock N× signal is a clock 3× signal which is 3 times faster than the core clock signal (also called Clock signal in FIG. 3B). The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A transmitter comprising:
an edge detector to detect one of a rising or falling edges of a clock signal;
a counter to count up or down in response to detecting one of the rising or falling edges of the clock signal, the counter having an output to generate a select signal;
first and second multiplexers each having a respective channel input coupled downstream from a data input signal node and each having a respective channel select input coupled to the output of the counter, the first and second multiplexers to generate respective legs of a differential pulse width modulated (PWM) signal as an output.

2. The transmitter of claim 1, wherein the PWM signal has a data rate compatible with MIPI® M-PHY$^{SM}$ GEAR rates 1 through 7.

3. The transmitter of claim 1, wherein the PWM signal is received by a MIPI® M-PHY$^{SM}$ receiver which is operable to receive signals with GEAR rates 1 through 7.

4. The transmitter of claim 1, wherein the clock signal has a frequency which is a multiple of a core clock signal frequency.

5. The transmitter of claim 4, wherein the counter is a 4-bit counter and the clock signal has a frequency which is 6 times faster than core clock frequency.

6. The transmitter of claim 4, wherein the counter is a 2-bit counter and the clock signal has a frequency which is 3 times faster than core clock frequency.

7. The transmitter of claim 1, wherein the counter is implemented as a chain of flip-flops, the output of the counter is from one of the flip-flips and a second channel select signal that is coupled to a second respective channel select input of the first and second multiplexers is from another of the flip-flops.

8. The transmitter of claim 7, wherein the counter is operable to be reset on every period of the core clock signal.

9. A method performed by a transmitter comprising:
detecting one of a rising or falling edges of a clock signal;
counting, by a counter, up or down in response to detecting one of the rising or falling edges of the clock signal, the counter to generate a select signal;
receiving a data signal for transmission at a data input node;
generating respective legs of a differential pulse width modulated (PWM) signal from first and second multiplexers each having respective channel inputs downstream from the data input node and that receive at respective channel select inputs the select signal from the counter.

10. The method of claim 9,
further comprising the counter operating as a chain of flip-flops where the select signal is generated from one of the flip-flops and a second select signal that is provided to a second respective channel select input of the first and second multiplexers is from another of the flip-flops.

11. A system comprising:
a display unit;
a processor, communicatively coupled to the display unit, including a transmitter, the transmitter comprising:
an edge detector to detect one of rising or falling edges of a clock signal;
a counter to count up or down in response to detecting one of the rising or falling edges of the clock signal, the counter having an output to generate a select signal;
first and second multiplexers each having a respective channel input coupled downstream from a data input signal node and each having a respective channel select input coupled to the output of the counter, the first and second multiplexers to generate respective legs of a differential pulse width modulated (PWM) signal as an output; and
a wireless interface to allow the processor to couple to another device.

12. The system of claim 11, wherein the display unit is a touch screen.

13. The system of claim 11, wherein the PWM signal has a data rate compatible with MIPI® M-PHY$^{SM}$ GEAR rates 1 through 7.

14. The system of claim 11, wherein the PWM signal is received by a MIPI® M-PHY$^{SM}$ receiver which is operable to receive signals with GEAR rates 1 through 7.

15. The system of claim 11, wherein the clock signal has a frequency which is a multiple of a core clock signal frequency.

16. The system of claim 15, wherein the counter is a 4-bit counter and the clock signal has a frequency which is 6 times faster than core clock frequency.

17. The system of claim 15, wherein the counter is a 2-bit counter and the clock signal has a frequency which is 3 times faster than core clock frequency.

18. The system of claim 11, wherein the counter is implemented as a chain of flip-flops, the output of the counter is from one of the flip-flops and a second channel select signal that is coupled to a second respective channel select input of the first and second multiplexers is from another of the flip-flops.

19. The system of claim 18, wherein the counter is operable to be reset on every period of the core clock signal.

* * * * *